(12) United States Patent
Jiang

(10) Patent No.: US 11,322,399 B2
(45) Date of Patent: May 3, 2022

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Li Jiang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/987,646

(22) Filed: Aug. 7, 2020

(65) Prior Publication Data
US 2021/0043510 A1   Feb. 11, 2021

(30) Foreign Application Priority Data

Aug. 9, 2019 (CN) .......................... 201910733450.4

(51) Int. Cl.
| | |
|---|---|
| *H01L 21/768* | (2006.01) |
| *H01L 23/522* | (2006.01) |
| *H01L 21/285* | (2006.01) |
| *H01L 23/532* | (2006.01) |

(52) U.S. Cl.
CPC .... *H01L 21/76879* (2013.01); *H01L 21/7684* (2013.01); *H01L 23/5226* (2013.01); *H01L 21/28568* (2013.01); *H01L 21/76843* (2013.01); *H01L 23/53257* (2013.01)

(58) Field of Classification Search
CPC .......... H01L 21/76879; H01L 21/7684; H01L 23/5226; H01L 21/28568; H01L 21/76843; H01L 23/53257; H01L 21/486; H01L 23/49827; H01L 23/5384
See application file for complete search history.

(56) References Cited

U.S. PATENT DOCUMENTS

2015/0371928 A1* 12/2015 Chen ................. H01L 21/30604
257/190

* cited by examiner

*Primary Examiner* — Julia Slutsker
(74) *Attorney, Agent, or Firm* — Anova Law Group, PLLC

(57) ABSTRACT

Semiconductor structure and method for forming the semiconductor structure are provided. An exemplary method includes: providing a substrate, including a first region and a second region; forming a gate structure over the substrate; forming a first interlayer dielectric layer over the substrate; forming a plurality of metal plugs in the first interlayer dielectric layer; forming a second interlayer dielectric layer over the first interlayer dielectric layer; forming a first via in the first region exposing a metal plug, and a second via in the second region exposing the first interlayer dielectric layer by etching the second interlayer dielectric layer; fully filling the first via with a first tungsten layer; forming an adhesion layer over the first tungsten layer, the second interlayer dielectric layer, and a sidewall and bottom of the second via; and fully filling the second via with a second tungsten layer.

13 Claims, 6 Drawing Sheets

SEMICONDUCTOR STRUCTURE AND FORMATION METHOD THEREOF

CROSS-REFERENCE TO RELATED APPLICATION

This application is a continuation of International Application No. 201910733450.4, filed Aug. 9, 2019, the entire content of which is incorporated herein by reference.

TECHNICAL FIELD

The present disclosure generally relates to the field of semiconductor manufacturing technologies and, more particularly, relates to a semiconductor structure and a formation method thereof.

BACKGROUND

Semiconductor device performance may often be improved by decreasing resistance-capacitance (RC) delay. As semiconductor technology nodes advance, the degree of integration of components in a semiconductor device becomes higher and higher, and critical dimensions become smaller and smaller. Correspondingly, further decreasing the RC delay becomes one of the important methods to improve device performance.

The continuous development of semiconductor technology requires a great deal for multilayer metallization, which generates high metal needs for filling hundreds of millions of vias to provide electrical paths between metal layers in semiconductor devices. Tungsten is usually selected as a filling material since tungsten has excellent gap filling ability and desirable anti-electromigration characteristics. However, tungsten plugs formed by existing processes, for filling tungsten in vias, have larger resistance, which is not beneficial to improving device performance of the formed semiconductor devices.

It is therefore desired to provide metal plugs with small resistance to improve the device performance of the semiconductor devices.

SUMMARY

The present disclosure provides a semiconductor structure and a formation method thereof to improve the device performance of the formed semiconductor devices.

One aspect of the present disclosure may provide a method for forming a semiconductor structure. The method may include: providing a substrate, including a first region and a second region; forming a gate structure over the substrate, and a source region and a drain region in the substrate on both sides of the gate structure; forming a first interlayer dielectric layer over the substrate, a top of the first interlayer dielectric layer being coplanar with a top of the gate structure; forming a plurality of metal plugs in the first interlayer dielectric layer, the metal plugs being connected to the source region and the drain region; forming a second interlayer dielectric layer over the first interlayer dielectric layer; forming a first via in the first region exposing a metal plug, and a second via in the second region exposing the first interlayer dielectric layer by etching the second interlayer dielectric layer; fully filling the first via with a first tungsten layer; forming an adhesion layer over the first tungsten layer, the second interlayer dielectric layer, and a sidewall and bottom of the second via; and fully filling the second via with a second tungsten layer.

Optionally, filling the first via with the first tungsten layer may include a selective deposition method.

Optionally, process parameters of the selective deposition method may include a reaction gas of tungsten hexafluoride and hydrogen, a reaction pressure of less than 20 torr, and a gas flow rate of tungsten hexafluoride and hydrogen ranging from 100 sccm to 300 sccm.

Optionally, filling the second via with the second tungsten layer may include: depositing the second tungsten layer over the adhesion layer; performing a chemical mechanical polishing (CMP) process on the second tungsten layer until exposing the adhesion layer; and performing another CMP process on the adhesion layer until exposing the second interlayer dielectric layer.

Optionally, depositing the second tungsten layer may include a chemical vapor deposition (CVD) method, a physical vapor deposition (PVD) method, or a combination thereof.

Optionally, performing the CMP process on the second tungsten layer may include a polishing pressure of 1 psi to 5 psi, a polish head rotation speed of 20 rpm to 100 rpm, and PH value of a polishing slurry ranging from 2 to 6.

Optionally, performing the another CMP process on the adhesion layer may include a polishing pressure of 1 psi to 5 psi, a polish head rotation speed of 20 rpm to 100 rpm, and PH value of a polishing slurry ranging from 2 to 6.

Optionally, forming the adhesion layer may include a CVD method, a PVD method, an atomic layer deposition (ALD) method, or a combination thereof.

Optionally, a material of the adhesion layer may include titanium nitride (TiN), tantalum nitride (TaN), titanium (Ti), or a combination thereof.

Optionally, a metal for forming the metal plug may include cobalt or tungsten.

Optionally, when the metal for forming the metal plug is cobalt, a protective layer may be formed over the cobalt before the first via is fully filled with the first tungsten layer.

Optionally, a material of the protective layer may include titanium nitride (TiN), tantalum nitride (TaN), tantalum (Ta), titanium (Ti), or a combination thereof.

Optionally, a material of the second interlayer dielectric layer may include silicon oxide (SiO), silicon nitride (SiN), silicon oxynitride (SiON), or a combination thereof.

Another aspect of the present disclosure may provide a semiconductor structure, including a substrate, a gate structure, a first interlayer dielectric layer, a plurality of metal plugs, a second interlayer dielectric layer, a first via, a second via, a first tungsten layer, an adhesion layer, and a second tungsten layer. The substrate may include a first region and a second region. The gate structure may be formed over the substrate, and a source region and a drain region, provided in the substrate on both sides of the gate structure. The first interlayer dielectric layer may be located over the substrate. A top of the first interlayer dielectric layer may be coplanar with a top of the gate structure. A plurality of metal plugs may be located in the first interlayer dielectric layer. The metal plugs may be connected to the source region and the drain region. A second interlayer dielectric layer may be located over the first interlayer dielectric layer. A first via may be located in the second interlayer dielectric layer of the first region and connected with a metal plug. A second via may be located in the second interlayer dielectric layer of the second region and may be connected with the first interlayer dielectric layer. The first tungsten layer may be located in the first via. A top of the first tungsten layer may be coplanar with a top of the second interlayer dielectric layer. The adhesion layer may be located over the first tungsten layer, the second interlayer dielectric layer, and a side surface and bottom of the second via. The second tungsten layer may be located in the second via. A top of the second tungsten layer may be coplanar with the top of the second interlayer dielectric layer.

Optionally, the first tungsten layer may be filled in the first via using a selective deposition method.

Optionally, process parameters of the selective deposition method may include a reaction gas of tungsten hexafluoride and hydrogen, a reaction pressure of less than 20 torr, and a gas flow rate of tungsten hexafluoride and hydrogen ranging from 100 sccm to 300 sccm.

Optionally, the second tungsten layer may be filled in the second via by depositing the second tungsten layer over the adhesion layer, performing a CMP process on the second tungsten layer until exposing the adhesion layer, and performing another CMP process on the adhesion layer until exposing the second interlayer dielectric layer.

Optionally, depositing the second tungsten layer may include a CVD method, a PVD method, or a combination thereof.

Optionally, performing the CMP process on the second tungsten layer may include a polishing pressure of 1 psi to 5 psi, a polish head rotation speed of 20 rpm to 100 rpm, and PH value of a polishing slurry ranging from 2 to 6.

Optionally, performing the another CMP process on the adhesion layer may include a polishing pressure of 1 psi to 5 psi, a polish head rotation speed of 20 rpm to 100 rpm, and PH value of a polishing slurry ranging from 2 to 6.

Compared to the existing technology, the technical solutions in accordance with various embodiments of the present disclosure may have the following advantages.

For example, after the first via is fully filled with the first tungsten layer, the adhesion layer is formed over the first tungsten layer, the second interlayer dielectric layer, and the sidewall and bottom of the second via, and then the second via is fully filled with the second tungsten layer. Since the metal tungsten has a poor adhesion on the surface of the dielectric layer, the second tungsten layer is filled in the second via through the adhesion layer. Thus, the holes on the surface of the second interlayer dielectric layer is fully filled, such that the surface of the second interlayer dielectric layer is flat after the subsequent CMP process and the planarization process. Therefore, the quality of the thin film subsequently formed over the second interlayer dielectric layer is improved so as to improve the device performance of the semiconductor structure.

Further, filling the first via with the first tungsten layer includes the selective deposition method. By using the selective deposition method to fill the first tungsten layer in the first via, the tungsten has a much larger deposition rate on the metal than on the dielectric layer. The tungsten grows upward from the middle of the bottom of the first via in a direction towards both sides. Therefore, no gap exists in the middle of the formed first tungsten layer. In this case, the polishing slurry cannot enter the gap to damage the metal of the metal plug when the first tungsten layer is polished. In another aspect, the tungsten grain formed by this method is larger. The larger the grain is, the smaller the resistance is. Therefore, the formed first tungsten layer has a smaller resistance, which is beneficial to improving the device performance of the semiconductor structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Semiconductor devices include conductive plugs. The conductive plugs may be formed by filling metal tungsten in vias since tungsten has excellent gap filling ability and desirable anti-electromigration characteristic. For example, a conductive plug may be formed by: depositing an oxide layer over a semiconductor substrate, etching the oxide layer to form a via, depositing an adhesion layer over the oxide layer, and sidewall and bottom of the via, and forming a thin tungsten layer over the adhesion layer as a seed layer based on reactions between a tungsten hexafluoride ($WF_6$) source gas and a mixed gas of silane ($SiH_4$) and hydrogen. Subsequent tungsten growth may be performed on the seed layer by reactions between hydrogen and tungsten hexafluoride ($WF_6$), followed by a planarization process on the metal tungsten.

Inventors of the present disclosure have found that the tungsten growth in a via may take place in a direction from two sides of the via to the middle of the via, and consequently a gap may be easily formed in the middle of the tungsten layer. When the planarization process is subsequently performed on the tungsten layer, the polishing slurry may enter the gap and cause corrosion to the underlying material. In addition, in the case that metal cobalt is used to form the metal plug under the tungsten thin film, the tungsten hexafluoride ($WF_6$) gas may cause corrosion to the metal cobalt. Further, the tungsten layer formed by tungsten growth may have small grain sizes and high resistance, which degrades the device performance of the formed semiconductor devices.

Various embodiments of the present disclosure provide a semiconductor structure and a method for forming the semiconductor structure. For example, a selective deposition method is used to deposit a first tungsten layer, such that the formed tungsten grain is relatively large, the resistance is relatively small, and no gap is formed in the middle of the first tungsten layer. Therefore, the cobalt metal may not be corroded, which is beneficial to improving the device performance of the semiconductor. At the same time, since tungsten cannot be directly formed over a dielectric layer, by depositing an adhesion layer first and then depositing a second cobalt layer, a second via in a second interlayer dielectric layer may be filled to cause a surface of the second interlayer dielectric layer flat. Therefore, quality of a thin film subsequently formed over the second interlayer dielectric layer is better, which is beneficial to improving the device performance of the semiconductor.

To make the above-described objectives, features, and beneficial effects of the present disclosure clearer, embodiments of the present disclosure are described in detail below in connection with the accompanying drawings.

Figure 10:
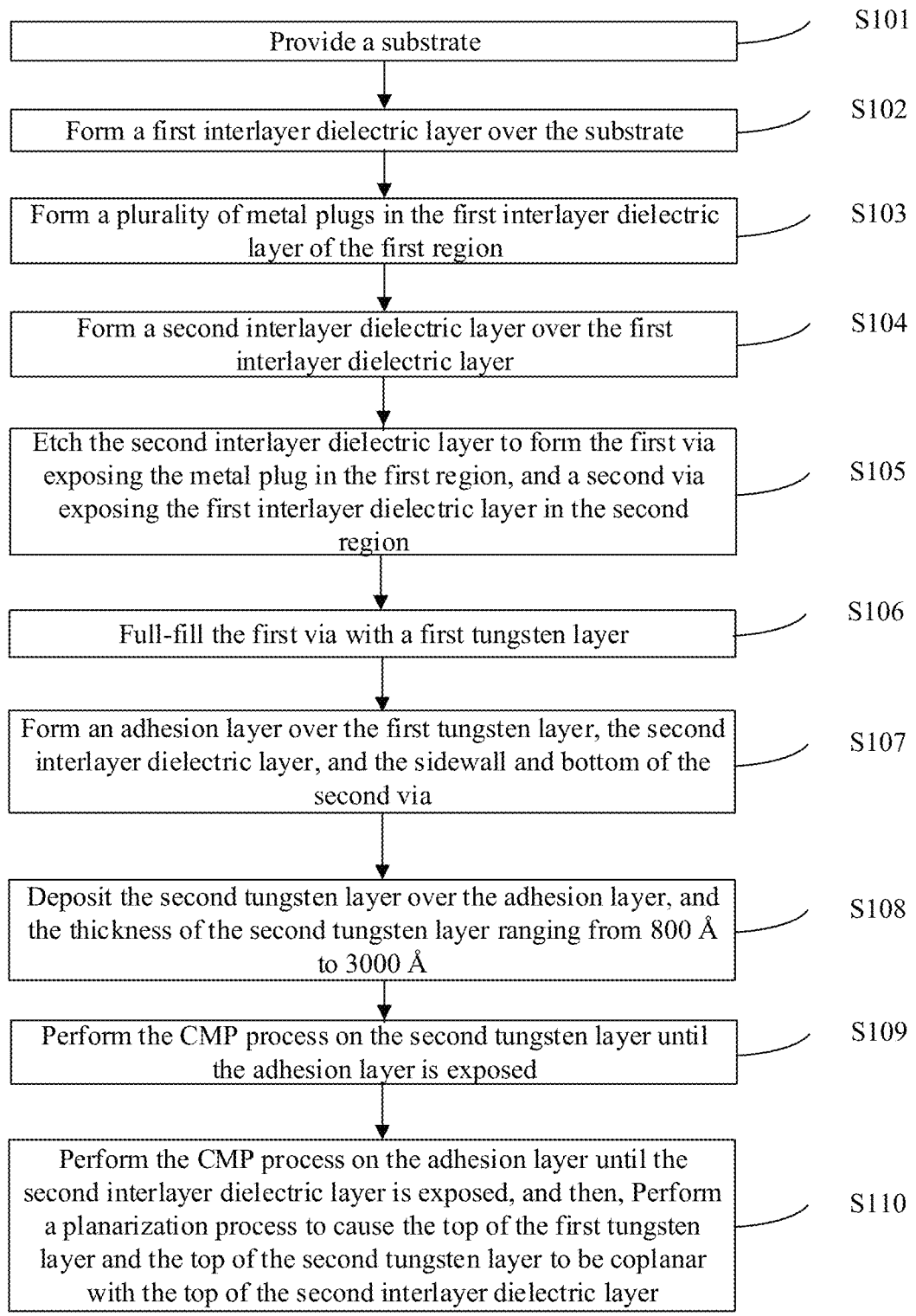
FIG. 10 illustrates a flowchart of an exemplary method for forming a semiconductor device according to some embodiments of the present disclosure.

FIGS. 1-8 illustrate schematic diagrams of cross-sectional structures at certain stages during a process of forming an exemplary semiconductor device according to some embodiments of the present disclosure. FIG. 10 illustrates a flowchart of an exemplary method for forming a semiconductor device according to some embodiments of the present disclosure.

Figure 1:
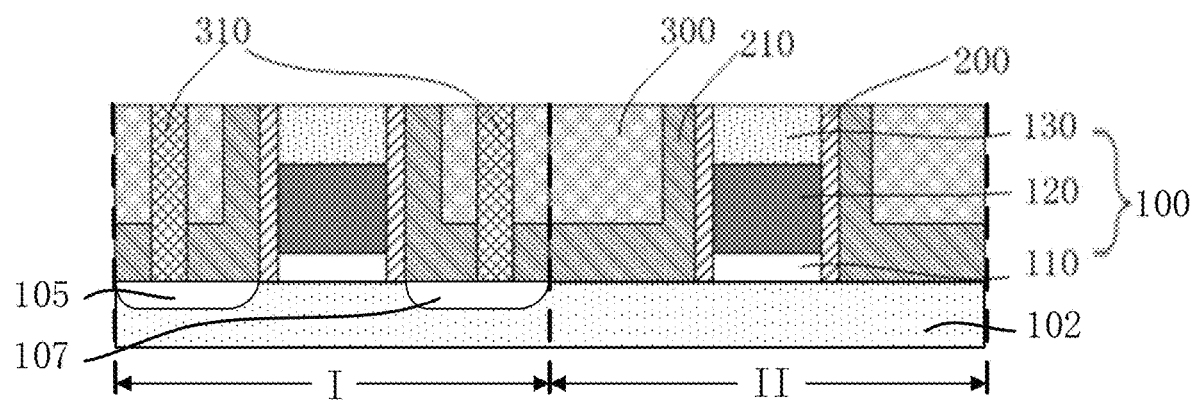
FIGS. 1-8 illustrate schematic diagrams of cross-sectional structures at certain stages during a process of forming an exemplary semiconductor device according to some embodiments of the present disclosure.

Referring to FIG. 10, in S101, a substrate is provided. FIG. 1 illustrates a corresponding structure.

As shown in FIG. 1, a substrate 102 is provided. The substrate includes a first region I and a second region II. A gate structure 100 is formed over the substrate 102. A source region 105 and a drain region 107 are provided in the substrate 102 on both sides of the gate structure 100.

In some embodiments, a material of the substrate 102 may include silicon (Si). In other embodiments, the material of the substrate 102 may include germanium (Ge), silicon-germanium (SiGe), silicon carbide (SiC), gallium arsenide (GaAs), indium gallium (InGa), or a combination thereof.

In some embodiments, the first region I includes a substrate region, for subsequently forming a metal plug. In some embodiments, the second region II may or may not include any metal plug.

In some embodiments, the gate structure 100 includes a metal gate. The gate structure 100 includes a work function layer 110 and a metal layer 120 located over the work function layer 110.

In some embodiments, the gate structure 100 includes a gate protective layer 130 over the metal layer 120.

A sidewall spacer 200 is formed on a sidewall of the gate structure 100. After forming the sidewall spacer 200, a source region 105 and a drain region 107 are formed in the substrate 102 on both sides of the gate structure 100, respectively. The source region 105 and the drain region 107, are doped regions for forming the semiconductor device.

An etch stop layer 210 is formed over the substrate and on a sidewall of the sidewall spacer 200. During a subsequent etching process for forming a contact via, a top of the etch stop layer 210 is used to define a stop position of the etching process, such that a problem of insufficient etching or over-etching is avoided.

Returning to FIG. 10, in S102, a first interlayer dielectric layer is formed over the substrate. FIG. 1 illustrates a corresponding structure.

As shown in FIG. 1, a first interlayer dielectric layer 300 is formed over the substrate 102. A top of the first interlayer dielectric layer 300 is coplanar with the top of the gate structure 100.

A material of the first interlayer dielectric layer 300 includes an insulation dielectric material. In some embodiments, the material of the first interlayer dielectric layer 300 includes silicon oxide (SiO). In other embodiments, the material of the first interlayer dielectric layer 300 may include silicon nitride (SiN), silicon oxynitride (SiON), or a combination thereof.

Returning to FIG. 10, in S103, a plurality of metal plugs are formed in the first interlayer dielectric layer of the first region I. FIG. 1 illustrates a corresponding structure.

As shown in FIG. 1, a plurality of metal plugs 310 are formed in the first interlayer dielectric layer 300 of the first region I. The metal plugs 310 are connected to the source region 105 and the drain region 107.

Forming the metal plugs 310 includes etching the first interlayer dielectric layer 300 to form a contact via (not shown), where the contact via exposes the substrate 102 where the source region 105 or the drain region 107 is located, filling the contact via with a metal material, which covers the top of the first interlayer dielectric layer, and using the planarization process to remove the metal material above the top of the first interlayer dielectric layer and using the remaining metal material in the contact via as the metal plug.

In some embodiments, a metal material for forming the metal plug 310 includes tungsten.

In other embodiments, the metal material may also include cobalt. When the metal material includes cobalt, before a first tungsten layer is subsequently filled in a first via, a protective layer needs to be deposited over a cobalt layer to prevent the cobalt layer from being damaged by tungsten hexafluoride ($WF_6$) gas when the first tungsten layer is filled.

A material of the protective layer may include titanium nitride (TiN), tantalum nitride (TaN), tantalum (Ta), titanium (Ti), or a combination thereof.

Figure 2:
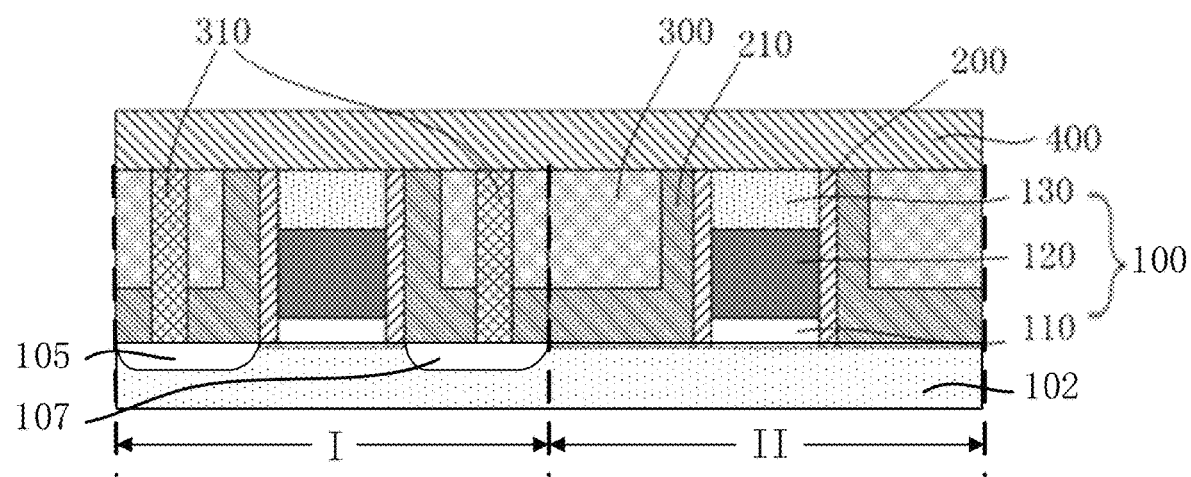

Referring to FIG. 10, in S104, a second interlayer dielectric layer is formed over the first interlayer dielectric layer. FIG. 2 illustrates a corresponding structure.

As shown in FIG. 2, second interlayer dielectric layer 400 is formed over the first interlayer dielectric layer 300.

In some embodiments, a material of the second interlayer dielectric layer 400 includes silicon oxide (SiO). In other embodiments, the material of the second interlayer dielectric layer 400 may include silicon nitride or silicon oxynitride.

In some embodiments, forming the second interlayer dielectric layer 400 includes a chemical vapor deposition (CVD) method. In other embodiments, forming the second interlayer dielectric layer 400 may include a physical vapor deposition (PVD) method, an atomic layer deposition (ALD) method, or a combination thereof.

Figure 3:
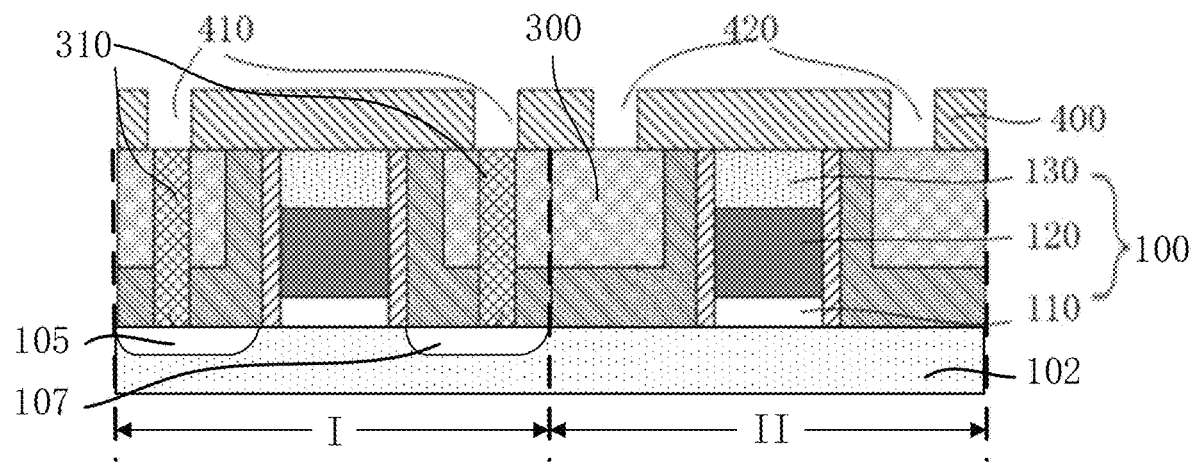

Referring to FIG. 10, in S105, the second interlayer dielectric layer is etched to form a first via exposing the metal plug in the first region I, and form a second via exposing the first interlayer dielectric layer in the second region II. FIG. 3 illustrates a corresponding structure.

As shown in FIG. 3, the second interlayer dielectric layer 400 is etched to form a first via 410 exposing the metal plug 310 in the first region I, and form a second via 420 exposing the first interlayer dielectric layer 300 in the second region II.

Etching the second interlayer dielectric layer 400 includes forming a patterned photoresist layer (not shown) over the second interlayer dielectric layer 400, using the patterned photoresist layer as a mask to etch the second interlayer dielectric layer 400 to form a via, and removing the patterned photoresist layer.

In some embodiments, etching the second interlayer dielectric layer 400 includes a dry etching method.

Figure 4:
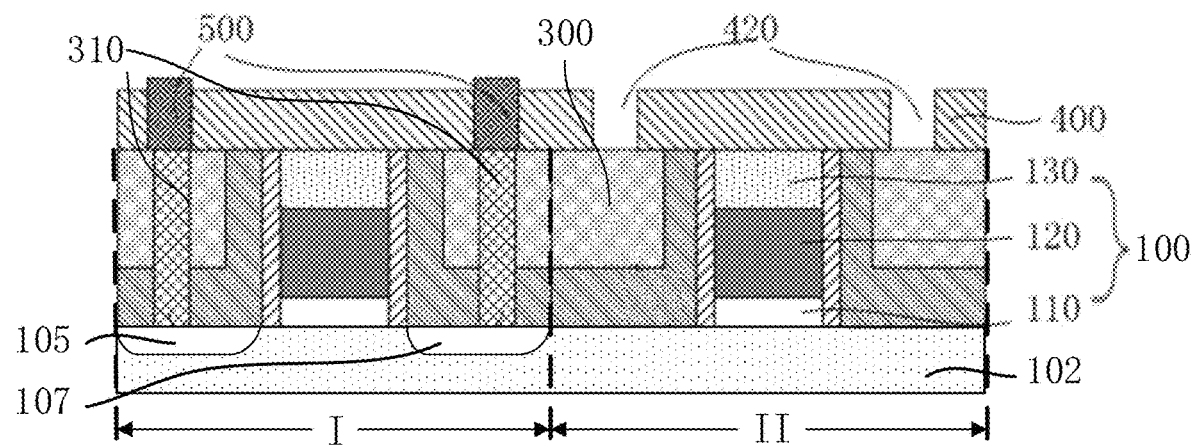

Referring to FIG. 10, in S106, the first via is fully filled with a first tungsten layer. FIG. 4 illustrates a corresponding structure.

As shown in FIG. 4, the first via 410 is fully filled with a first tungsten layer 500.

In some embodiments, the selective deposition method is used to deposit the first tungsten layer 500. Parameters of the selective deposition method for depositing the tungsten layer includes a reaction gas including tungsten hexafluoride ($WF_6$) and hydrogen, reaction pressure less than 20 torr, and a gas flow rate of 100~300 sccm for the reaction gas including tungsten hexafluoride and hydrogen.

Using the selective deposition method to deposit the first tungsten layer 500 includes the following beneficial effects.

First, with the selective deposition method, tungsten has a faster deposition rate on the metal than the dielectric layer. Tungsten grows from the middle bottom of the via upward and to both sides, such that no gap is formed in the first tungsten layer 500. Therefore, when the first tungsten layer 500 is subsequently polished, the polishing slurry is prevented from entering the gap to damage the metal plug 310. Second, by using the selective deposition method, the formed tungsten grain is relatively large. The larger the grain is, the smaller the resistance is. Thus, a tungsten via with a smaller resistance is obtained, which is beneficial to improving the device performance of the semiconductor structure.

In some embodiments, the formed first tungsten layer 500 fully fills the first via 410. The first tungsten layer 500 is 200 Å to 400 Å higher than the second interlayer dielectric layer 400.

A chemical mechanical polishing (CMP) process is subsequently performed on the first tungsten layer 500 to remove a portion of the first tungsten layer 500 that is higher than the second interlayer dielectric layer 400. Then, the top of the first tungsten layer 500 is coplanar with the top of the second interlayer dielectric layer 400.

Figure 5:
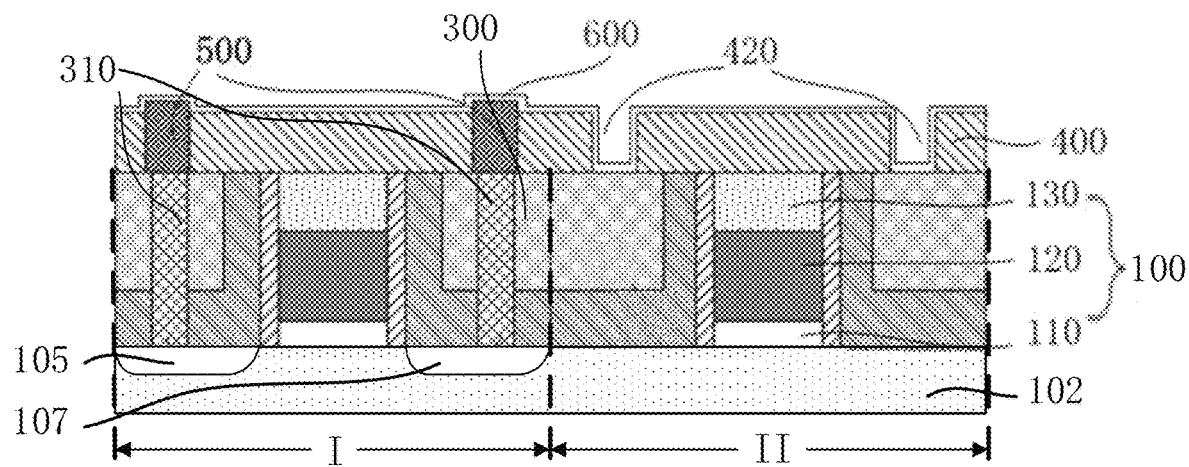

Referring to FIG. 10, in S107, an adhesion layer is formed over the first tungsten layer, the second interlayer dielectric layer, and the sidewall and bottom of the second via. FIG. 5 illustrates a corresponding structure.

As shown in FIG. 5, an adhesion layer 600 is formed over the first tungsten layer 500, the second interlayer dielectric layer 400, and the sidewall and bottom of the second via 420.

The reason to form the adhesion layer 600 includes as follows. The first via 410 is communicated with the metal plug 310, and the second via 420 is communicated with the first interlayer dielectric layer 300. Since tungsten has poor adhesion on the dielectric layer, tungsten may not adhere to the surface of the second via 420 when the tungsten layer is subsequently filled in the second via 420. Therefore, the adhesion layer 600 needs to be formed first, and the tungsten layer can be filled in the second via 420 through the adhesion layer 600.

In some embodiments, forming the adhesion layer 600 includes the CVD method. In other embodiments, forming adhesion layer 600 may include the PVD method, the ALD method, or a combination thereof.

In some embodiments, a material of the adhesion layer 600 includes titanium nitride (TiN). In other embodiments, the material of the adhesion layer 600 may include a stacked structure of tantalum nitride (TaN), titanium nitride (TiN), titanium (Ti), or a combination thereof.

In some embodiments, a thickness of the adhesion layer 600 ranges from 10 Å to 100 Å.

Figure 6:
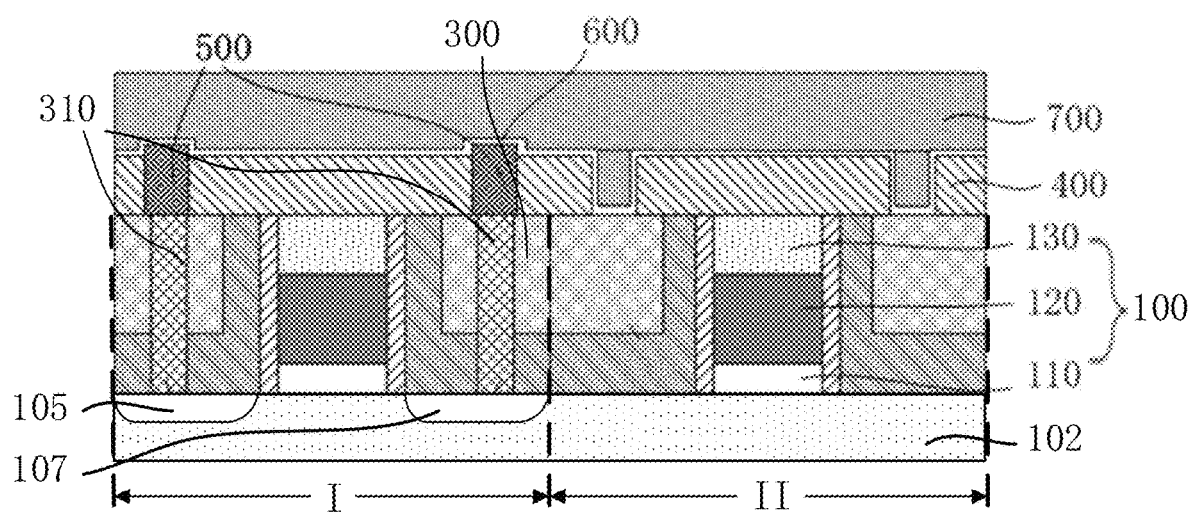

Referring to FIG. 10, in S108, the second tungsten layer is deposited over the adhesion layer and fully fills the second via, and the thickness of the second tungsten layer ranges from 800 Å to 3000 Å. FIG. 6 illustrates a corresponding structure.

As shown in FIG. 6, the second tungsten layer 700 is deposited over the adhesion layer 600 and fully fills the second vias 420, and the thickness of the second tungsten layer 700 over the adhesion layer 600 ranges from 800 Å to 3000 Å.

As such, although no metal plugs are formed in the first dielectric layer 300 in the second region II, the second vias 420 in the second region II are also filled with the second tungsten layer 700. In the case without filling the second vias 420 with the second tungsten layer, an uneven surface of the second interlayer dielectric layer 400 may occur. When subsequently forming a semiconductor multilayer interconnection structure, a thin film needs to be formed over the second interlayer dielectric layer 400. The unevenness of the surface of the second interlayer dielectric layer 400 may cause poor quality for the formed thin film, which affects the device performance of the semiconductor structure. Therefore, to obtain a flat surface for the second interlayer dielectric layer 400, the second tungsten layer 700 needs to be fully filled in the second vias 420 and over the adhesion layer 600. The second tungsten layer 700 may serve as a sacrificial layer for forming a flat surface for the second interlayer dielectric layer 400, after subsequently removing the second tungsten layer 700, the adhesion layer 600, a portion of the first tungsten layer 500, and the second interlayer dielectric layer 400. As such, the quality of the thin film, subsequently formed over the second interlayer dielectric layer 400, is improved for forming the semiconductor multilayer interconnection structure.

In some embodiments, depositing the second tungsten layer 700 includes the CVD method. In other embodiments, depositing the second tungsten layer 700 may include the PVD method, ALD method, or a combination thereof.

Figure 7:
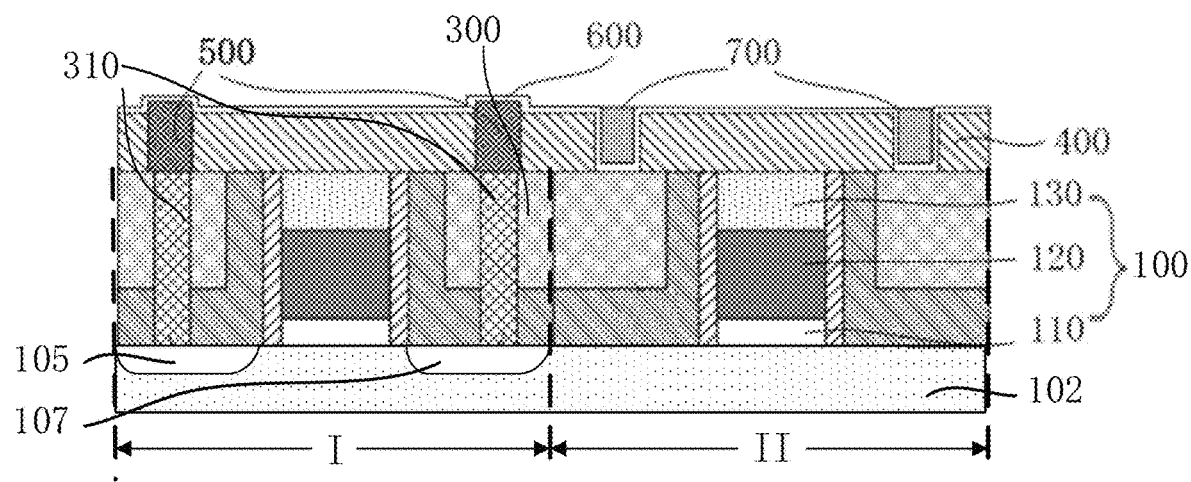

Referring to FIG. 10, in S109, the CMP process is performed on the second tungsten layer until the adhesion layer is exposed. FIG. 7 illustrates a corresponding structure.

As shown in FIG. 7, the CMP process is performed on the second tungsten layer 700 until the adhesion layer 600 is exposed.

In some embodiments, performing the CMP process on the second tungsten layer 700 includes polishing pressure of 1 psi to 5 psi, polish head rotation speed of 20 rpm to 100 rpm, PH value of a polishing slurry ranging from 2 to 6, and the polishing slurry containing a tungsten anticorrosive.

In some embodiments, in addition to facilitating the deposition of the second tungsten layer 700, in one aspect, the adhesion layer 600 may also be used as a polishing stop layer. Therefore, when a polishing slurry with a high selection ratio is selected for the CMP process performed on the second tungsten layer 700, the polishing stops on the adhesion layer 600. Thereby, the underlying materials are prevented from being damaged due to over-polishing. In another aspect, the adhesion layer 600 covers the first tungsten layer 500 and the second interlayer dielectric layer 400. Thus, the adhesion layer 600 can protect the first tungsten layer 500 and the second interlayer dielectric layer 400 from being damaged when the second tungsten layer is polished.

Figure 8:
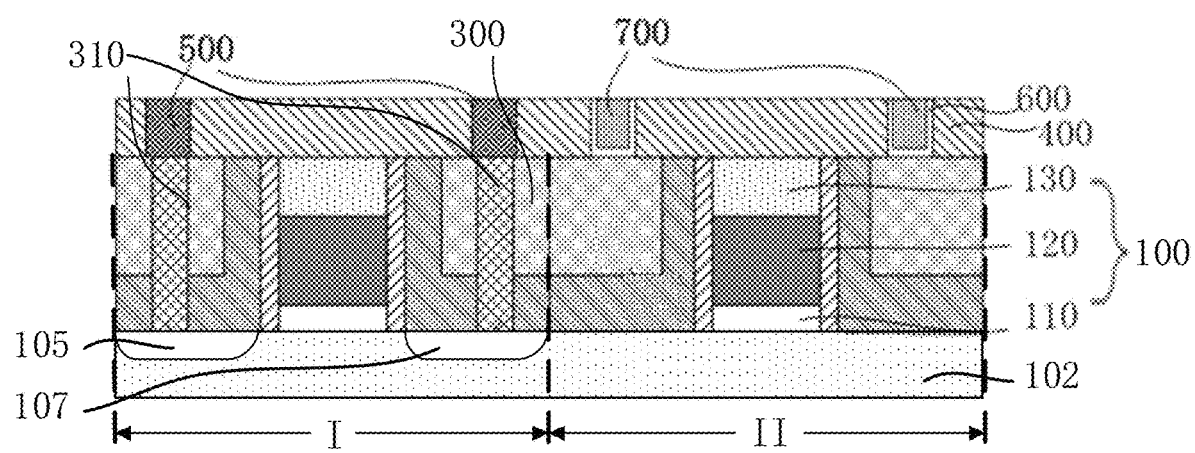

Referring to FIG. 10, in S110, the CMP process is performed on the adhesion layer until the second interlayer dielectric layer is exposed, and then, a planarization process is performed to cause the top of the first tungsten layer and the top of the second tungsten layer to be coplanar with the top of the second interlayer dielectric layer. FIG. 8 illustrates a corresponding structure.

As shown in FIG. 8, the CMP process is performed on the adhesion layer 600 until the second interlayer dielectric layer 400 is exposed. Then, a planarization process is performed to cause the top of the remaining first tungsten layer 500 and the top of the remaining second tungsten layer 700 to be coplanar with the top of the second interlayer dielectric layer 400.

In some embodiments, the CMP process includes the polishing pressure of 1 psi to 5 psi, the polish head rotation speed of 20 rpm to 100 rpm, the PH value of the polishing slurry ranging from 2 to 6, and the polishing slurry containing the tungsten anticorrosive.

After the CMP process is performed on the adhesion layer 600, the planarization process is performed on the second interlayer dielectric layer 400 to cause the top of the first tungsten layer and the top of the second tungsten layer to be coplanar with the top of the second interlayer dielectric layer.

The method for forming the semiconductor structure provided by embodiments of the present disclosure includes depositing the tungsten metal in the first via 410 by using the selective deposition method, such that the formed tungsten via has low resistance, which is beneficial to improving the electrical performance of the semiconductor structure. Further, since the selective deposition method cannot deposit tungsten over the dielectric layer, the second via 420 is filled by forming the adhesion layer 600 on the surface of the second via 420, followed by forming the second tungsten layer 700 over the adhesion layer 600. As such, after the CMP process and planarization process, the surface of the second interlayer dielectric layer is flat, which is beneficial to improving the device performance of the semiconductor.

Figure 9:
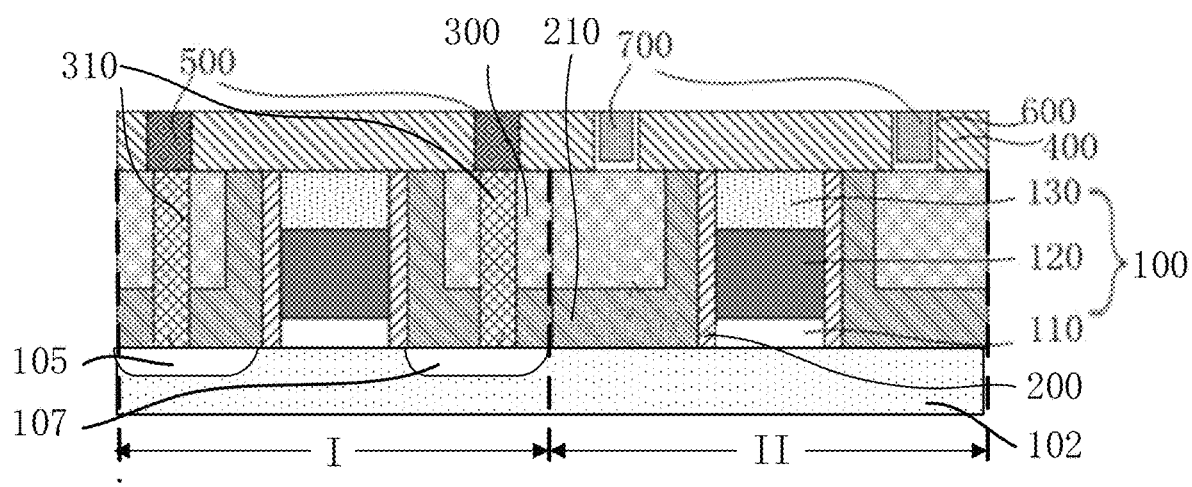
FIG. 9 illustrates a schematic structure of an exemplary semiconductor structure according to some embodiments of the present disclosure.

FIG. 9 illustrates a schematic structure diagram of a semiconductor structure according to some embodiments of the present disclosure. Correspondingly, the present disclosure provides a semiconductor structure.

The semiconductor structure includes a substrate 102. The substrate 102 includes a first region I and a second region II. A gate structure 100 is formed over the substrate. A source region 105 and a drain region 107 are provided in the substrate 102 on both sides of the gate structure 100. The semiconductor structure further includes a first interlayer dielectric layer 300 located over the substrate 102. A top of the first interlayer dielectric layer 300 is coplanar with a top of the gate structure. The semiconductor structure further includes metal plugs 310 located in the first interlayer dielectric layer 300 of the first region I and connected to the source region 105 and the drain region 107. The semiconductor structure further includes a second interlayer dielectric layer 400 located over the first interlayer dielectric layer 300, a first via 410 located in the second interlayer dielectric layer 400 and communicated with the metal plug 310, a second via 420 located in the second interlayer dielectric layer 400 of the second region II and communicated with the first interlayer dielectric layer 300, and a first tungsten layer 500 located in the first via 410. The tops of the first tungsten layer 500 are coplanar with the top of the second interlayer dielectric layer 400. The semiconductor structure further includes an adhesion layer 600 located on the sidewall and bottom of the second via 420 and a second tungsten layer 700 located in the second via 420. The top of the second tungsten layer 700 is coplanar with the top of the first tungsten layer 500 and the top of the second interlayer dielectric layer 400.

In some embodiments, the gate structure 100 includes a metal gate. The gate structure 100 includes a work function layer 110 and a metal layer 120 located over the work function layer 110.

In some embodiments, the gate structure 100 further includes a gate protective layer 130 over the metal layer 120.

The semiconductor structure further includes a sidewall spacer 200 located on the sidewall of the gate structure 100 and an etch stop layer 210 located over the substrate 102 and on the sidewall of the sidewall spacer 200.

In some embodiments, the metal for forming the metal plug 310 includes cobalt. In other embodiments, the metal for forming the metal plug 310 may include tungsten.

In some embodiments, a material of the second interlayer dielectric layer 400 includes silicon oxide (SiO). In other embodiments, the material of the second interlayer dielectric layer 400 may include silicon nitride or silicon oxynitride.

In some embodiments, a material of the adhesion layer 600 includes titanium nitride (TiN). In other embodiments, the material of the adhesion layer 600 may include a stacked structure of tantalum nitride (TaN), titanium nitride (TiN), titanium (Ti), or a combination thereof.

The above-detailed descriptions only illustrate exemplary embodiments of the present disclosure and are not intended to limit the scope of the present disclosure. Those skilled in the art can understand the specification as a whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
   providing a substrate, including a first region and a second region;
   forming a gate structure over the substrate, and a source region and a drain region in the substrate on both sides of the gate structure;
   forming a first interlayer dielectric layer over the substrate, a top of the first interlayer dielectric layer being coplanar with a top of the gate structure;
   forming a plurality of metal plugs in the first interlayer dielectric layer, the metal plugs being connected to the source region and the drain region;
   forming a second interlayer dielectric layer over the first interlayer dielectric layer;
   forming a first via in the first region exposing a metal plug, and a second via in the second region exposing the first interlayer dielectric layer by etching the second interlayer dielectric layer;
   fully filling the first via with a first tungsten layer;
   forming an adhesion layer over the first tungsten layer, the second interlayer dielectric layer, and a sidewall and bottom of the second via; and
   fully filling the second via with a second tungsten layer.

2. The method according to claim 1, wherein filling the first via with the first tungsten layer includes a selective deposition method.

3. The method according to claim 2, wherein process parameters of the selective deposition method includes a reaction gas of tungsten hexafluoride and hydrogen, a reaction pressure of less than 20 torr, and a gas flow rate of tungsten hexafluoride and hydrogen ranging from 100 sccm to 300 sccm.

4. The method according to claim 1, wherein filling the second via with the second tungsten layer includes:
   depositing the second tungsten layer over the adhesion layer;
   performing a chemical mechanical polishing (CMP) process on the second tungsten layer until exposing the adhesion layer; and
   performing another CMP process on the adhesion layer until exposing the second interlayer dielectric layer.

5. The method according to claim 4, wherein depositing the second tungsten layer includes a chemical vapor deposition (CVD) method, a physical vapor deposition (PVD) method, or a combination thereof.

6. The method according to claim 4, wherein performing the CMP process on the second tungsten layer includes a polishing pressure of 1 psi to 5 psi, a polish head rotation speed of 20 rpm to 100 rpm, and PH value of a polishing slurry ranging from 2 to 6.

7. The method according to claim 4, wherein performing the another CMP process on the adhesion layer includes a polishing pressure of 1 psi to 5 psi, a polish head rotation speed of 20 rpm to 100 rpm, and PH value of a polishing slurry ranging from 2 to 6.

8. The method according to claim 1, wherein forming the adhesion layer includes a CVD method, a PVD method, an atomic layer deposition (ALD) method, or a combination thereof.

9. The method according to claim 1, wherein a material of the adhesion layer includes titanium nitride (TiN), tantalum nitride (TaN), titanium (Ti), or a combination thereof.

10. The method according to claim 1, wherein a metal for forming the metal plug includes cobalt or tungsten.

11. The method according to claim 10, wherein when the metal for forming the metal plug is cobalt, a protective layer is formed over the cobalt before the first via is fully filled with the first tungsten layer.

12. The method according to claim 11, wherein a material of the protective layer includes titanium nitride (TiN), tantalum nitride (TaN), tantalum (Ta), titanium (Ti), or a combination thereof.

13. The method according to claim 11, wherein a material of the second interlayer dielectric layer includes silicon oxide (SiO), silicon nitride (SiN), silicon oxynitride (SiON), or a combination thereof.

* * * * *